(12) United States Patent
Kimura et al.

(10) Patent No.: US 11,929,238 B2
(45) Date of Patent: Mar. 12, 2024

(54) ION BEAM PROCESSING APPARATUS AND METHOD FOR CONTROLLING OPERATION THEREOF

(71) Applicant: JEOL Ltd., Tokyo (JP)

(72) Inventors: Tatsuhito Kimura, Tokyo (JP); Munehiro Kozuka, Tokyo (JP)

(73) Assignee: JEOL Ltd., Tokyo (JP)

(*) Notice: Subject to any disclaimer, the term of this patent is extended or adjusted under 35 U.S.C. 154(b) by 121 days.

(21) Appl. No.: 17/583,464

(22) Filed: Jan. 25, 2022

(65) Prior Publication Data

US 2022/0238310 A1    Jul. 28, 2022

(30) Foreign Application Priority Data

Jan. 26, 2021 (JP) ................. 2021-010268

(51) Int. Cl.
 *H01J 37/32* (2006.01)
(52) U.S. Cl.
 CPC ... *H01J 37/32449* (2013.01); *H01J 2237/186* (2013.01); *H01J 2237/2007* (2013.01)
(58) Field of Classification Search
 CPC ........ H01J 37/3056; H01J 37/08; H01J 37/18; H01J 2237/06; H01J 2237/1825; H01J 2237/31745; H01J 2237/0807; F04D 19/042
 See application file for complete search history.

(56) References Cited

U.S. PATENT DOCUMENTS

2014/0197329 A1* 7/2014 Muto ............... H01J 37/28
                                                    250/423 F

FOREIGN PATENT DOCUMENTS

| EP | 1739308 A1 | 1/2007 |
| EP | 2960520 A1 | 12/2015 |
| JP | S60167192 U | 11/1985 |
| JP | 62191696 A | 8/1987 |
| JP | 3182698 A | 8/1991 |

OTHER PUBLICATIONS

Extended European Search Report issued in EP22151113.2 dated Jun. 27, 2022.

* cited by examiner

*Primary Examiner* — David E Smith
*Assistant Examiner* — Hsien C Tsai
(74) *Attorney, Agent, or Firm* — The Webb Law Firm

(57) ABSTRACT

At timing t0, a brake gas (raw material gas) starts to be supplied to an ion beam generator, and the brake gas is fed into a turbo molecular pump. After timing t1, a vent valve is opened intermittently to feed atmospheric air into the turbo molecular pump. The brake gas may be different from the raw material gas. The brake gas is supplied using a gas supply system.

7 Claims, 19 Drawing Sheets

1ST COMPARATIVE EXAMPLE

1ST COMPARATIVE EXAMPLE

2ND COMPARATIVE EXAMPLE

2ND COMPARATIVE EXAMPLE

ION BEAM PROCESSING APPARATUS AND METHOD FOR CONTROLLING OPERATION THEREOF

CROSS REFERENCE TO RELATED APPLICATION

This application claims priority to Japanese Patent Application No. 2021-010268 filed Jan. 26, 2021, the disclosure of which is hereby incorporated by reference in its entirety.

BACKGROUND

Field of the Disclosure

The present disclosure relates to an ion beam processing apparatus and a method for controlling the operation of the ion beam processing apparatus, and in particular to a technique for decelerating and stopping a turbo molecular pump in an apparatus for processing a sample using an ion beam.

Description of Related Art

Observing a sample with a scanning electron microscope or transmission electron microscope requires preprocessing of the sample. An ion beam processing apparatus is used for the preprocessing. Several types of ion beam processing apparatuses have been known, including a cross-section fabricating apparatus that fabricates a cross-section of a sample, a thin-film fabricating apparatus that processes a part of a sample into a thin film, and the like. A typical ion beam processing apparatus processes a sample by emitting an ion beam to the sample. A raw material gas such as argon gas is used to generate the ion beam.

The ion beam processing apparatus usually includes a turbo molecular pump (TMP) to create high vacuum in an ionization chamber and a sample chamber. The turbo molecular pump includes a rotating body with a plurality of rotating blade rows aligned in a direction of the rotation axis. Each rotating blade row consists of a plurality of rotating blades aligned in the circumferential direction. The rotational speed of the rotating body can reach, for example, tens of thousands of revolutions per minute.

In the ion beam processing apparatus, it is necessary to return the sample chamber to or close to atmospheric pressure without damaging the turbo molecular pump before removing the sample after processing. In other words, it is necessary to decelerate the rotating body in the turbo molecular pump without applying an excessive load on the rotating body.

JP S62-191696 A and JP H03-182698 A disclose techniques to decelerate the turbo molecular pump using a brake gas, but do not disclose a system to supply a raw material gas to the ion beam generator.

SUMMARY OF THE INVENTION

It is an object of the present disclosure to utilize an existing configuration to stop a turbo molecular pump in an apparatus for processing a sample by emitting an ion beam to the sample. It is another object of the present disclosure to safely stop a turbo molecular pump in a relatively short time in an apparatus for processing a sample by emitting an ion beam to the sample.

An ion beam processing apparatus according to the present disclosure includes an ion beam generator that includes an ionization chamber and generates an ion beam for processing a sample, a housing having a sample chamber communicating with the ionization chamber, a gas supply system that supplies a raw material gas to the ionization chamber, a turbo molecular pump that suctions the sample chamber and creates vacuum in the sample chamber and the ionization chamber, and a controller that controls the gas supply system by supplying a brake gas which is identical to or different from the raw material gas into the ionization chamber during deceleration of the turbo molecular pump, to thereby supply the brake gas into the turbo molecular pump from the ionization chamber through the sample chamber.

A method for controlling an operation of an ion beam processing apparatus according to the present disclosure includes a first decelerating step for supplying a brake gas which is identical to or different from a raw material gas into an ionization chamber, to thereby supply the brake gas into the turbo molecular pump from the ionization chamber through the sample chamber, and a second decelerating step, subsequent to the first decelerating step, for supplying atmospheric air into the sample chamber or the turbo molecular pump while continuing to supply the brake gas into the ionization chamber.

BRIEF DESCRIPTION OF DRAWINGS

Embodiments of the present disclosure will be described based on the following figures, wherein.

DESCRIPTION OF EMBODIMENTS

Figure 1:
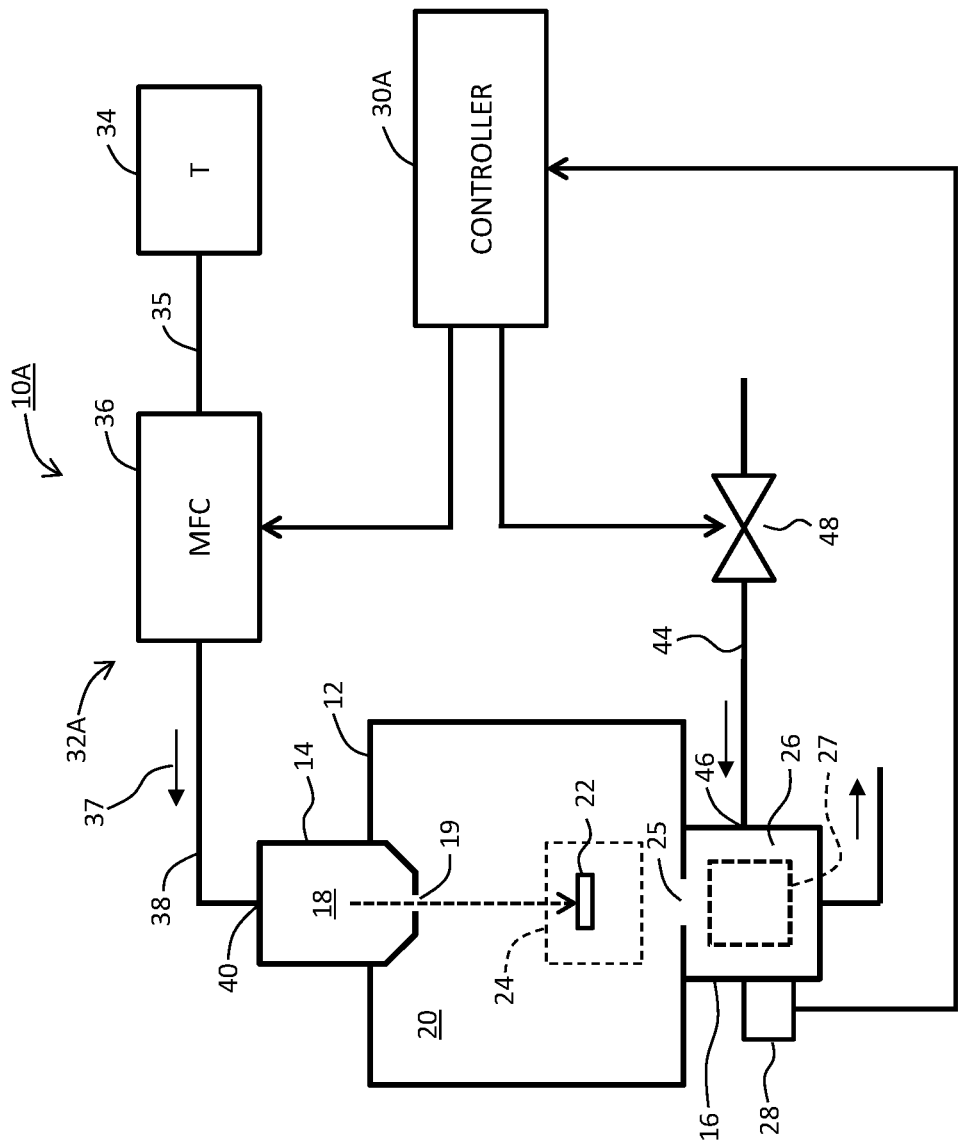
FIG. 1 is a schematic diagram illustrating the configuration of an ion beam processing apparatus according to a first embodiment.

Embodiments will be described below with reference to the accompanying drawings.

(1) Outline of Embodiments

An ion beam processing apparatus according to embodiments includes an ion beam generator, a housing, a gas supply system, a turbo molecular pump, and a controller. The ion beam generator includes an ionization chamber and generates an ion beam for processing a sample. The housing includes a sample chamber communicating with the ionization chamber. The gas supply system supplies a raw material gas to the ionization chamber. The turbo molecular pump suctions the sample chamber to create vacuum in the sample chamber and the ionization chamber. The controller controls the gas supply system to supply a brake gas which is identical to or different from the raw material gas to the ionization chamber during deceleration of the turbo molecular pump, to thereby supply the brake gas into the turbo molecular pump from the ionization chamber through the sample chamber.

With the above configuration, the brake gas is supplied to the ionization chamber using the gas supply system for generating an ion beam, and the brake gas is supplied from the ionization chamber into the turbo molecular pump through the sample chamber, thus applying a braking load on the turbo molecular pump. Because a part of or all the gas supply system can be used to decelerate the turbo molecular pump, the configuration can be simplified and the cost can be reduced as compared to the case where a dedicated brake gas supply system is provided for deceleration. The gas supply system usually includes a controllable flow rate regulating means. By controlling such a flow rate regulating means, it is possible to optimize the magnitude of the braking effect on the turbo molecular pump. This prevents application of an unexpected excessive load on the turbo molecular pump, thereby avoiding damage or failure of the turbo molecular pump. As the flow rate of the brake gas is optimized, the deceleration and stopping time of the turbo molecular pump can be shortened as a result.

In the embodiments, the gas supply system includes piping drawn from a gas inlet port of the ion beam generator and a flow rate regulator provided on the piping. The controller controls the flow rate regulator during the deceleration to regulate the flow rate of the brake gas flowing through the flow rate regulator. In the embodiments, a raw material gas tank is provided to feed the raw material gas to the flow rate regulator. The raw material gas is used as the brake gas. It is convenient to use the raw material gas as the brake gas if a sufficient amount of the raw material gas is available. The capacity of the raw material gas tank may be determined in consideration of using the raw material gas as the brake gas. In the embodiments, the flow rate regulator is configured by a mass flow controller capable of regulating the flow rate with high precision.

In the embodiments, an atmospheric release state in which the interior of the turbo molecular pump is opened to the atmosphere occurs after the deceleration. In the atmospheric relief state, the controller controls the flow rate regulator to supply the raw material gas to the ionization chamber. In the ionization chamber, a high voltage is applied to discharge electrodes and ion drawing electrodes, so that it is desired to prevent the ingress of atmospheric air (especially moisture and foreign substances) to the ionization chamber. Such a configuration can effectively prevent or reduce the inflow of the atmospheric air into the ionization chamber.

In the embodiments, a raw material gas tank that feeds the raw material gas to the flow rate regulator and a brake gas tank that feeds the brake gas to the flow rate regulator are provided. The brake gas is fed to the flow rate regulator during the deceleration. This configuration allows the use of an inexpensive gas as the brake gas. Alternatively, a high-purity gas may be used as the raw material gas and a low-purity gas may be used as the brake gas.

In the embodiments, an atmospheric release state in which the interior of the turbo molecular pump is opened to the atmosphere occurs after the deceleration. In the atmospheric release state, the controller controls the flow rate regulator to supply the brake gas or the raw material gas to the ionization chamber. This configuration can prevent or reduce the inflow of the atmospheric air into the ionization chamber and protects the ion beam generator.

In the embodiments, an atmospheric relief valve is provided. The controller controls the atmospheric release valve to supply the atmospheric air into the sample chamber or the turbo molecular pump in the middle of the deceleration. This configuration decreases a consumption amount of the brake gas while protecting the ion beam generator. The atmospheric air with a controlled or regulated flow rate may be fed through a port formed on the housing or the turbo molecular pump.

An operation control method according to an embodiment includes a first decelerating step and a second decelerating step. The first decelerating step supplies a brake gas which is identical to or different from the raw material gas to an ionization chamber using a gas supply system connected to the ionization chamber, to thereby supply the brake gas into the turbo molecular pump from the ionization chamber through the sample chamber. The second decelerating step, subsequent to the first decelerating step, supplies atmospheric air into the sample chamber or the turbo molecular pump while continuing to supply the brake gas to the ionization chamber. This configuration makes it possible to decelerate the turbo molecular pump in a relatively short time while protecting the ion beam generator with a simple configuration.

In the embodiments, subsequent to the second decelerating step, the brake gas continues to be supplied into the ionization chamber in a state in which the turbo molecular pump is stopped. This configuration can protect the ion beam generator or accelerate resumption of ion beam generation in or from the stopped state of the turbo molecular pump.

(2) Details of Embodiments

FIG. 1 illustrates the configuration of an ion beam processing apparatus 10A according to a first embodiment. The ion beam processing apparatus 10A performs preprocessing of a sample to be observed with a scanning electron microscope or transmission electron microscope, and in particular, fabricates a cross-section of a sample or processes a part of a sample into a thin film using an ion beam. The configuration described below may be applied to other ion beam processing apparatuses.

The ion beam processing apparatus 10A includes a housing 12 serving as an enclosure, an ion beam generator 14, and a turbo molecular pump 16. An auxiliary pump is also provided separate from the turbo molecular pump 16, but is not illustrated herein. The ion beam generator 14 is attached on the top of the housing 12. The ion beam generator 14 is also referred to as an ion source or an ion gun. The ion beam generator 14 generates ion beams, and the generated ion beams are directed downward as illustrated in the drawing.

Specifically, the inside of the ion beam generator 14 is an ionization chamber 18. Ions are generated in the ionization chamber 18. The inside of the housing 12 is a sample chamber 20. The ionization chamber 18 and the sample chamber 20 are communicated with each other via an orifice (small hole) 19. Ion beams pass through the orifice 19.

A sample 22 is placed for processing in the sample chamber 20. A mechanical system 24 corresponds to a holder and a stage. The sample 22 is held by the holder, and the holder is mounted on the stage. The stage changes the position and orientation of the sample. The holder also has the function of holding a shielding plate, a masking material, and the like which are used during processing of the sample. The housing 12 has a door which is opened and closed when the sample 22 is loaded and unloaded.

The turbo molecular pump 16 is provided adjacent to the housing 12. The interior 26 of the turbo molecular pump 16 communicates with the sample chamber 20 through an opening 25. A rotating body 27 subject to rotary motion is provided in the interior 26 of the turbo molecular pump 16. The rotating body 27 includes a plurality of rotor blade rows aligned in the direction of the rotation axis. Each rotor blade row has a plurality of rotor blades arranged radially. A motor is installed in the interior 26 of the turbo molecular pump 16. The motor has a stator and a rotor. The rotor is a part of the rotating body 27 described above. An auxiliary pump is provided in the latter stage of the turbo molecular pump 16, as described above.

A rotational speed sensor 28 detects the rotational speed of the rotating body 27. Typically, the rotational speed sensor 28 outputs a speed signal to a controller 30A which will be described later. In the process of evacuating the sample chamber 20 and the ionization chamber 18 to create vacuum, the auxiliary pump usually operates first, and when a degree of vacuum in the sample chamber 20 and the like reaches a certain level, the turbo molecular pump starts to operate. Thus, the sample chamber is brought into a high vacuum state.

A gas supply system 32A supplies a raw material gas to the ion beam generator 14. Specifically, the raw material gas is, for example, argon gas. In that case, the ion beam is an argon ion beam. A raw material gas tank (raw material gas cylinder) 34 is filled with the raw material gas, and the raw material gas is sent from the raw material gas tank 34 to a flow rate regulator 36 via piping 35. The flow rate regulator 36 is specifically a mass flow controller capable of regulating the flow rate with high accuracy.

The raw material gas with regulated flow rate is sent from the flow rate regulator 36 to the ionization chamber 18 in the ion beam generator 14 through piping 38. A port 40 is formed on the housing of the ion beam generator 14, and the piping 38 is drawn out from the port 40. In the first embodiment, the raw material gas is used as the brake gas during the deceleration of the turbo molecular pump 16 (see reference number 37).

A port 46 is formed on the housing of the turbo molecular pump 16, and piping 44 is coupled to the port 46. A vent valve 48 is provided on the piping 44. The vent valve 48 is an atmospheric relief valve that feeds atmospheric air to the interior 26 of the turbo molecular pump 16 to return the interior 26 to atmospheric pressure. The vent valve 48 is a solenoid valve. The solenoid valve may also be used as other valves described later.

The controller 30A controls the operation of the constituent components illustrated in FIG. 1. Specifically, the controller 30A controls the operations of the ion beam generator 14, the mechanical system 24, the turbo molecular pump 16, the auxiliary pump, the flow rate regulator 36, the vent valve 48, and the like. In doing this, a speed signal is referenced, as necessary. The controller 30A can be configured by a processor. An example of the processor is a central processing unit (CPU) that executes programs.

In processing the sample, the ion beam generator 14 generates an ion beam under the control of the controller 30A, and the ion beam is made to irradiate the sample 22. At this time, the ion beam generator 14 receives the raw material gas having a certain flow rate. The turbo molecular pump 16 is set to an operating state to maintain the degree of vacuum in the sample chamber 20 and the like. The rotational speed sensor 28 detects the rotational speed of the turbo molecular pump 16.

When the processing of the sample is completed, the power supply to the motor in the turbo molecular pump 16 stops before the sample 22 is removed from the sample chamber 20. Subsequently, the rotating body 27 continues to rotate due to inertia. In the first embodiment, to stop the rotating body 27 safely and forcibly, the controller 30A causes the raw material gas and the atmospheric air to flow into the turbo molecular pump 16, which will be described in detail later in connection with FIGS. 2 and 3.

Figure 2:
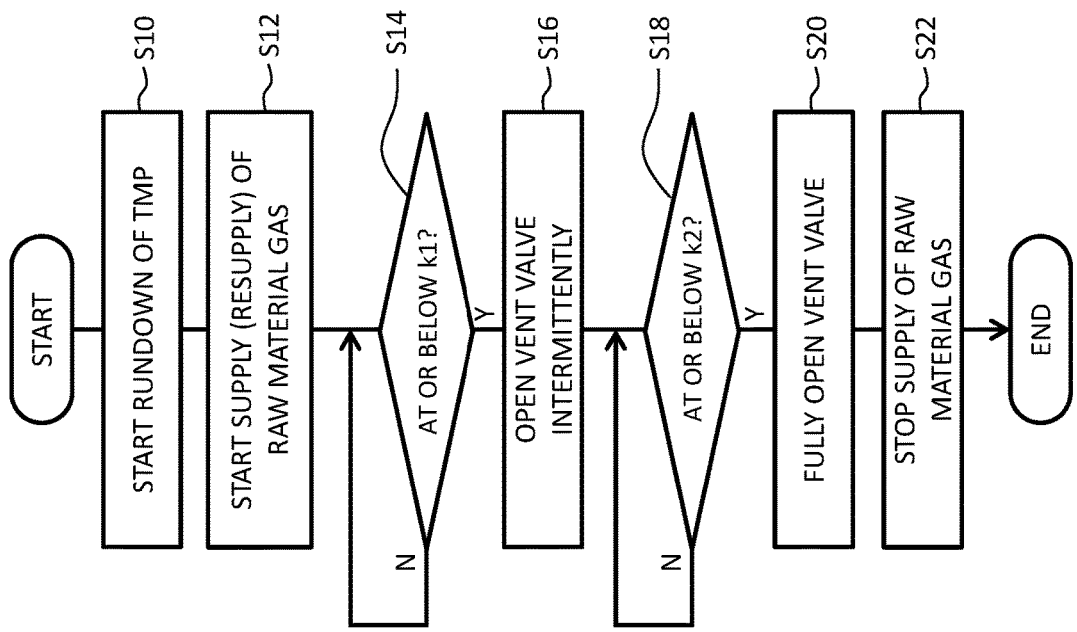
FIG. 2 is a flowchart illustrating the operation of the ion beam processing apparatus according to the first embodiment.

FIG. 2 is a flowchart illustrating the operation of stopping the turbo molecular pump. Contents of the flowchart illustrate the control details of the controller described above.

When the processing of the sample is completed, the supply of the raw material gas (argon gas) to the ion beam generator stops. In this state, step S10 of FIG. 2 is executed. In S10, the motor of the turbo molecular pump stops and the rundown of the turbo molecular pump starts. In S12, the supply of the brake gas to the ion beam generator starts. In the first embodiment the brake gas is the raw material gas, and its flow rate is controlled to a constant value. The brake gas is supplied from the ionization chamber into the turbo molecular pump through the sample chamber. Supplying the brake gas to the turbo molecular pump after passing through a certain space makes it possible to avoid application of a sudden large load on the individual rotor blades. The flow rate of the brake gas is determined so as to not apply an excessive load thereon.

In S14, it is determined whether the rotational speed of the turbo molecular pump gas has dropped to or below k1. If the rotational speed is at or below k1, the vent valve is opened intermittently in S16. Since the flow rate of the atmospheric air passing through the vent valve is limited, a large amount of atmospheric air does not rush into the turbo molecular pump at once. In S18, it is determined whether the rotational speed has dropped to or below k2. If the rotational speed is at or below k2, indicating that the rotational speed of the turbo molecular pump has become sufficiently low, the vent valve is fully opened in S20. In S22, the supply of the brake gas as the raw material gas stops. At around this time, the interior of the turbo molecular pump and the interior of the sample chamber come to be at atmospheric pressure. k1 and k2 are parameters that have been optimized in advance through experiments or the like from the viewpoint of protecting the turbo molecular pump and reducing the time required for stopping it.

Figure 3:
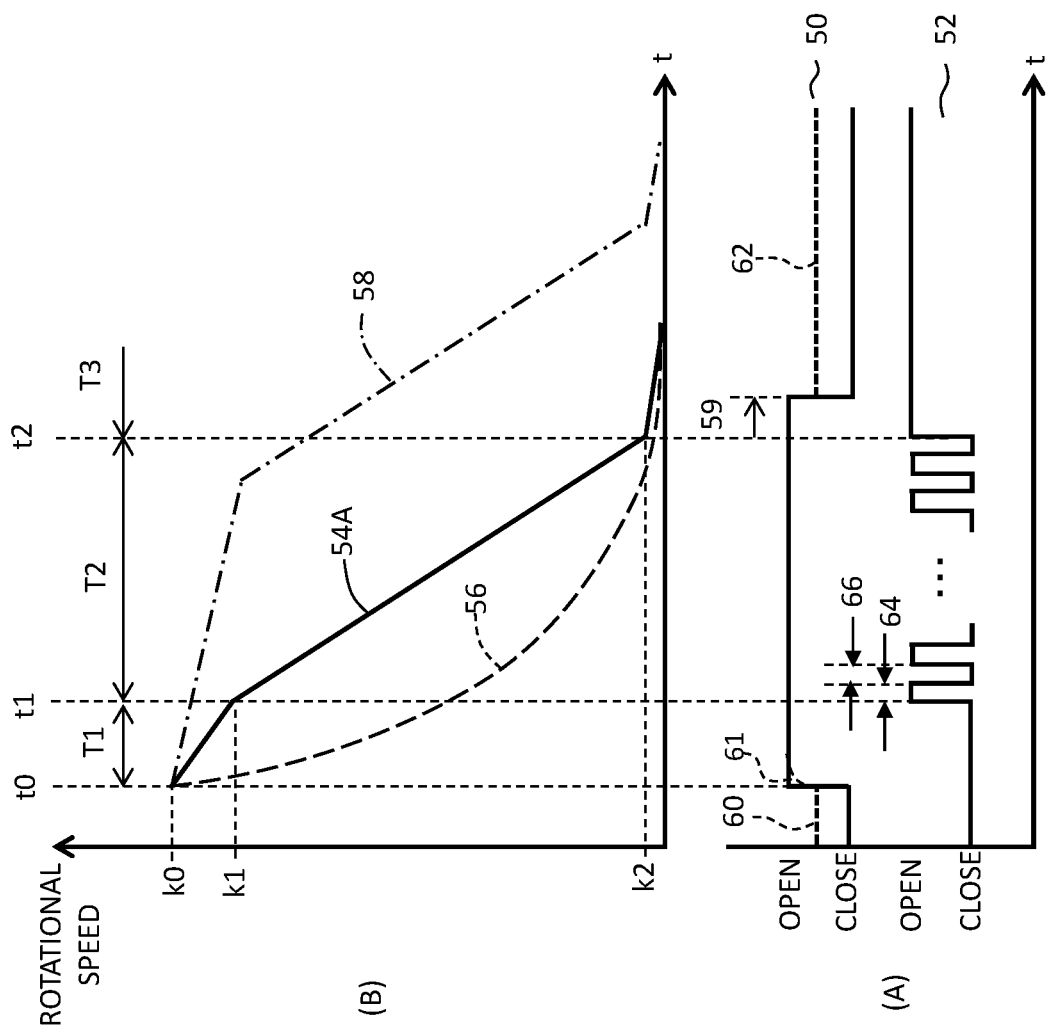
FIG. 3 is an explanatory diagram for explaining the operation of the ion beam processing apparatus according to the first embodiment.

With reference to FIG. 3, the operation above is described more in detail. The lower part (A) of FIG. 3 shows the operation of the flow rate regulator (see reference number 50) and the operation of the vent valve (see reference number 52). The upper part (B) of FIG. 3 shows the changes of the rotational speed of the turbo molecular pump. Specifically, the change of the rotational speed according to the first embodiment is indicated by reference number 54A. The change of the rotational speed according to a first comparative example is indicated by the reference number 56. The change of the rotational speed according to a second comparative example is indicated by reference number 58. Details of the first and second comparative examples will be described later.

At timing t0, the rundown of the turbo molecular pump starts. From that point, the flow rate regulator supplies the raw material gas as the brake gas to the ion beam generator. In the period T1 from timing t0 to timing t1, the rotational speed of the turbo molecular pump gradually decreases due to the action of the brake gas. As in the first comparative example, if a relatively large amount of atmospheric air is introduced after the start of the rundown to rapidly decrease the rotational speed, the rotating body is likely to be broken or damaged. Such a problem can be avoided by the present embodiment.

At timing t1, when it is determined that the rotational speed has reached or fallen below k1, the vent valve is intermittently opened. A time width of the open state is indicated by reference number 64, and a time width of the closed state is indicated by reference number 66. These time widths may be changed dynamically, or alternatively, the flow rate in the open state may be changed dynamically. During the period T2, the atmospheric air with a controlled flow rate is supplied in addition to the brake gas with a controlled flow rate, thus raising the rate of decrease (slope) of the rotational speed without increasing the flow rate of the brake gas.

At timing t2, when the rotational speed reaches or falls below k2, the vent valve is fully opened. In the period T3, the interior of the turbo molecular pump, the interior of the sample chamber, and the like come to be at atmospheric pressure. After that, the turbo molecular pump stops completely. In the first embodiment, stopping the supply of the brake gas is delayed until after timing t2. The delay time is indicated by reference number 59.

In the second comparative example, the rotating state due to inertia is maintained as is, and when the rotational speed reaches k1, the atmospheric air starts to be introduced into the turbo molecular pump through the vent valve. In this case, it takes a relatively long time for the rotational speed to reach k1, causing a prolonged time until the turbo molecular pump stops completely.

In contrast, the first embodiment uses the raw material gas as the brake gas, and the brake gas with its flow rate highly regulated by the flow rate regulator can be supplied to the turbo molecular pump from the beginning. Thus, the time required to stop the turbo molecular pump can be shortened.

As indicated by reference number 60, after the processing of the sample, the supply of the raw material gas may continue without stopping, and the raw material gas may be used as the brake gas. In this case, the flow rate of the raw material gas may be maintained or, alternatively, may set appropriately for individual purposes. Further, as indicated by reference number 62, the supply of the raw material gas may continue without stopping after the vent valve is fully opened. For example, the supply of the raw material gas may continue until the processing of the next sample starts. Such a configuration can prevent or reduce the inflow of the atmospheric air into the ion beam generator, thus protecting the ion beam generator or shortening the preparation time for processing the next sample. In other words, a high voltage is applied to the ion beam generator for generation or drawing of ions. Therefore, it is desirable to prevent the ingress of moisture and foreign substances into the beam generator to the extent possible. If the supply of the raw material gas to the ion beam generator is maintained while the sample chamber is at atmospheric pressure, the ingress of moisture or foreign substances into the ion beam generator can be effectively prevented. Alternatively, it is also possible to reduce the time required to remove moisture or foreign substances from the ion beam generator prior to processing the next sample. In starting the supply of the brake gas, the flow rate of the brake gas may be gradually increased (see reference number 61). This makes it possible to further protect the rotating body.

Figure 4:
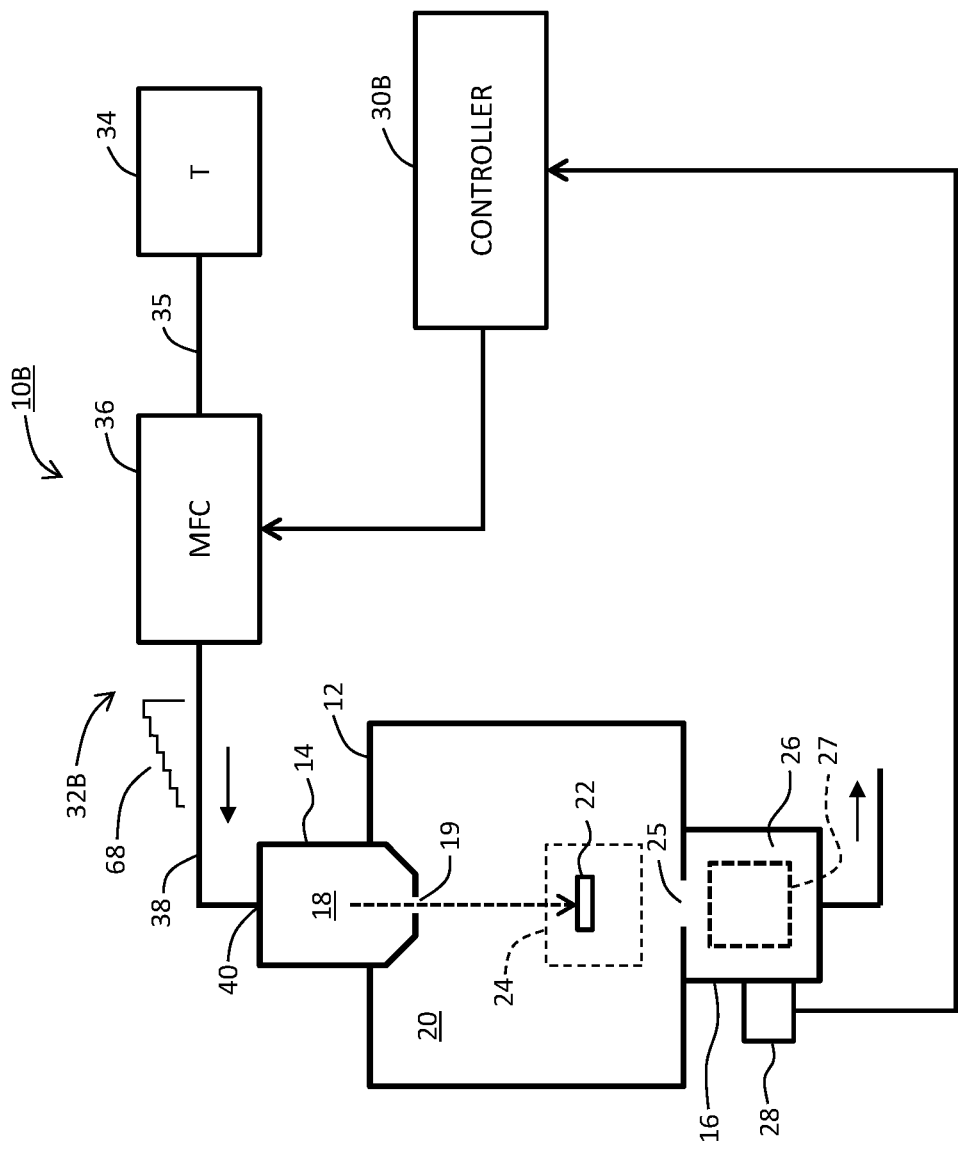
FIG. 4 is a schematic diagram illustrating the configuration of an ion beam processing apparatus according to a second embodiment.
Figure 5:
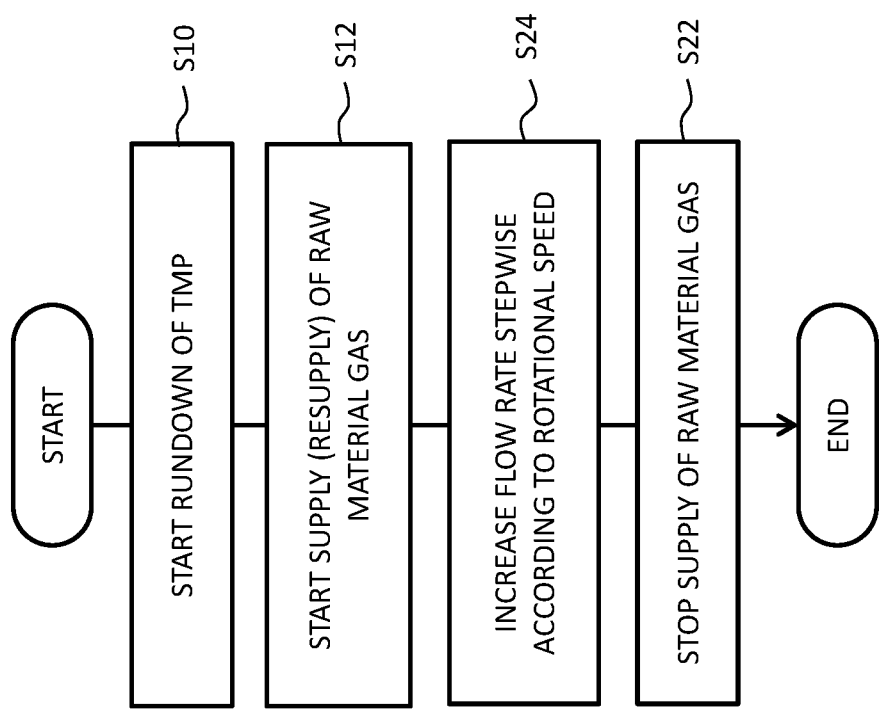
FIG. 5 is a flowchart illustrating the operation of the ion beam processing apparatus according to the second embodiment.
Figure 6:
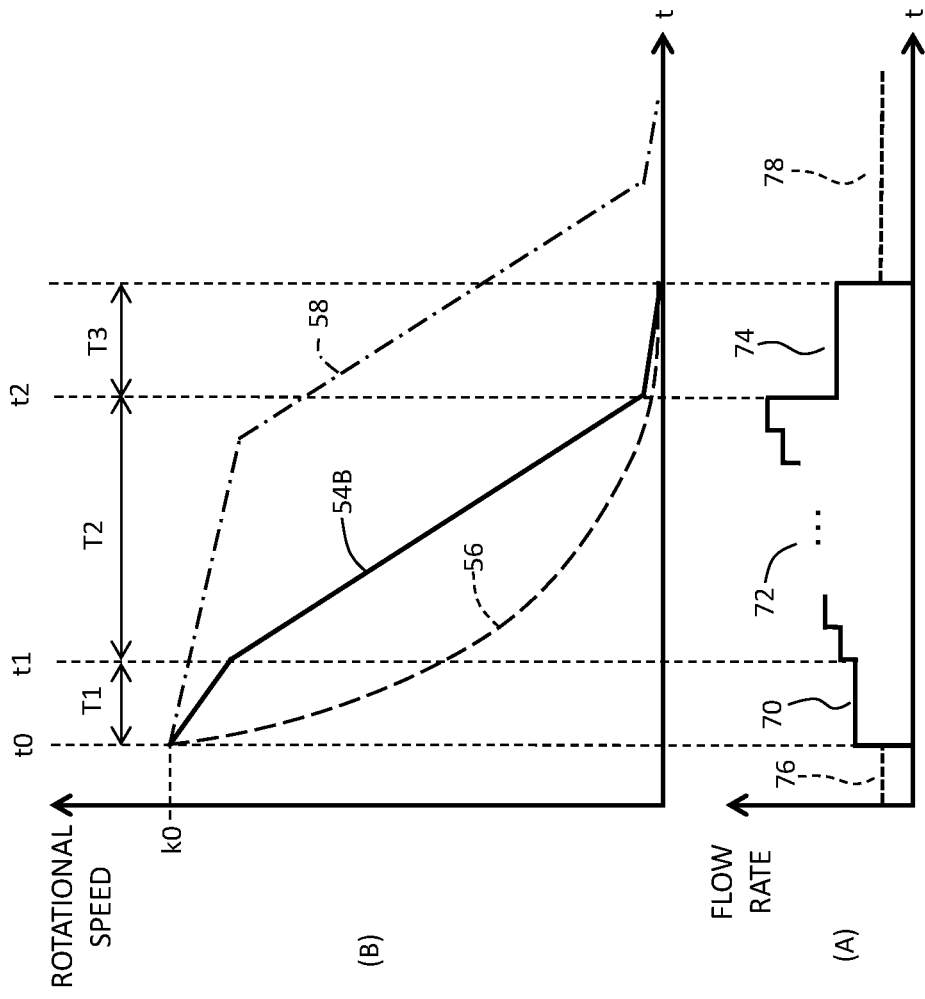
FIG. 6 is an explanatory diagram for explaining the operation of the ion beam processing apparatus according to the second embodiment.

FIGS. 4 to 6 illustrate a second embodiment. The constituent components illustrated in FIGS. 4 to 6 similar to those illustrated in FIGS. 1 to 3 are marked with the same reference numerals and the explanation thereof is omitted.

In FIG. 4, an ion beam processing apparatus 10B according to the second embodiment includes a gas supply system 32B, and its operation is controlled by a controller 30B. Again, in the second embodiment, the raw material gas is used as the brake gas. The vent valve is not provided in the second embodiment. The flow rate of the brake gas as the raw material gas is controlled to increase in a stepwise manner during the deceleration of the turbo molecular pump 16 (see reference number 68).

FIG. 5 illustrates the operation of the second embodiment. In S10, the rundown of the turbo molecular pump starts. In S12, the supply of the brake gas (raw material gas) to the ion beam generator starts. Subsequently, in S24, the flow rate of the brake gas increases stepwise according to the rotational speed of the turbo molecular pump. When the rotation stops or nearly stops, the supply of the brake gas stops in S22.

FIG. 6 specifically illustrates the operation of the second embodiment. The lower part (A) of FIG. 6 shows the temporal change of the flow rate of the brake gas. In the first period T1, an initial flow rate 70 is set so as not to apply excessive load on the turbo molecular pump, and then the flow rate increases stepwise during the period T2 (see reference number 72). Instead of the stepwise change, the change may occur continuously. A function to determine the flow rate from the rotational speed may be provided and used to determine flow rate. In the period T3, a constant flow rate 74 is set. If the rotational speed is sufficiently close to zero, the flow rate in period T3 may be set to zero.

The upper part (B) of FIG. 6 shows a rotational speed change 54B of the second embodiment similar to that of the first embodiment. After processing the sample, the supply of the raw material gas may be not stopped but maintained (see reference number 76). After the turbo molecular pump stops, the supply of the brake gas may be maintained (see reference number 78) to prevent or reduce the ingress of the atmospheric air into the ion beam generator.

Figure 7:
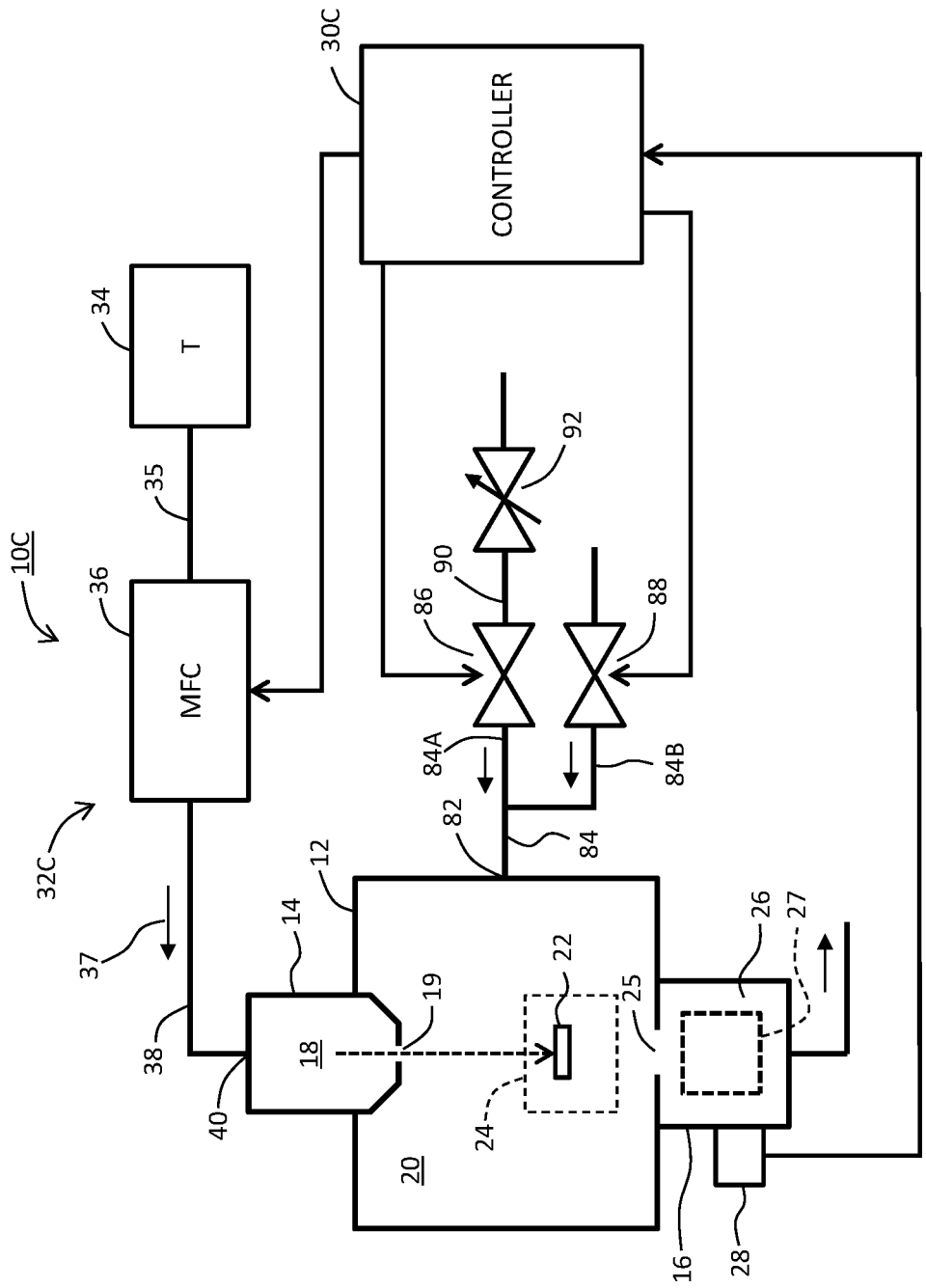
FIG. 7 is a schematic diagram illustrating the configuration of an ion beam processing apparatus according to a third embodiment.
Figure 8:
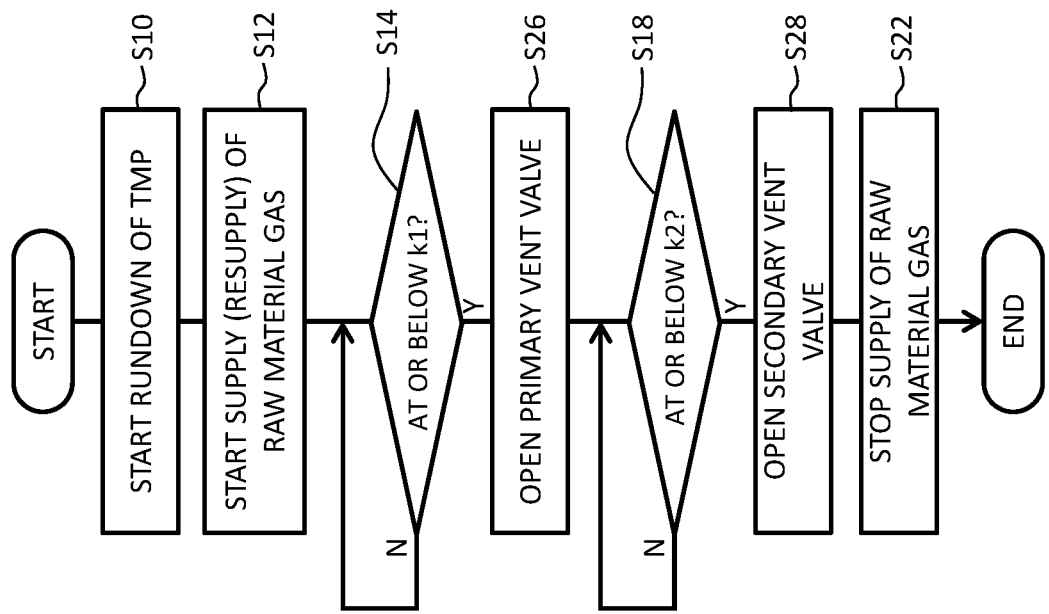
FIG. 8 is a flowchart illustrating the operation of the ion beam processor according to the third embodiment.
Figure 9:
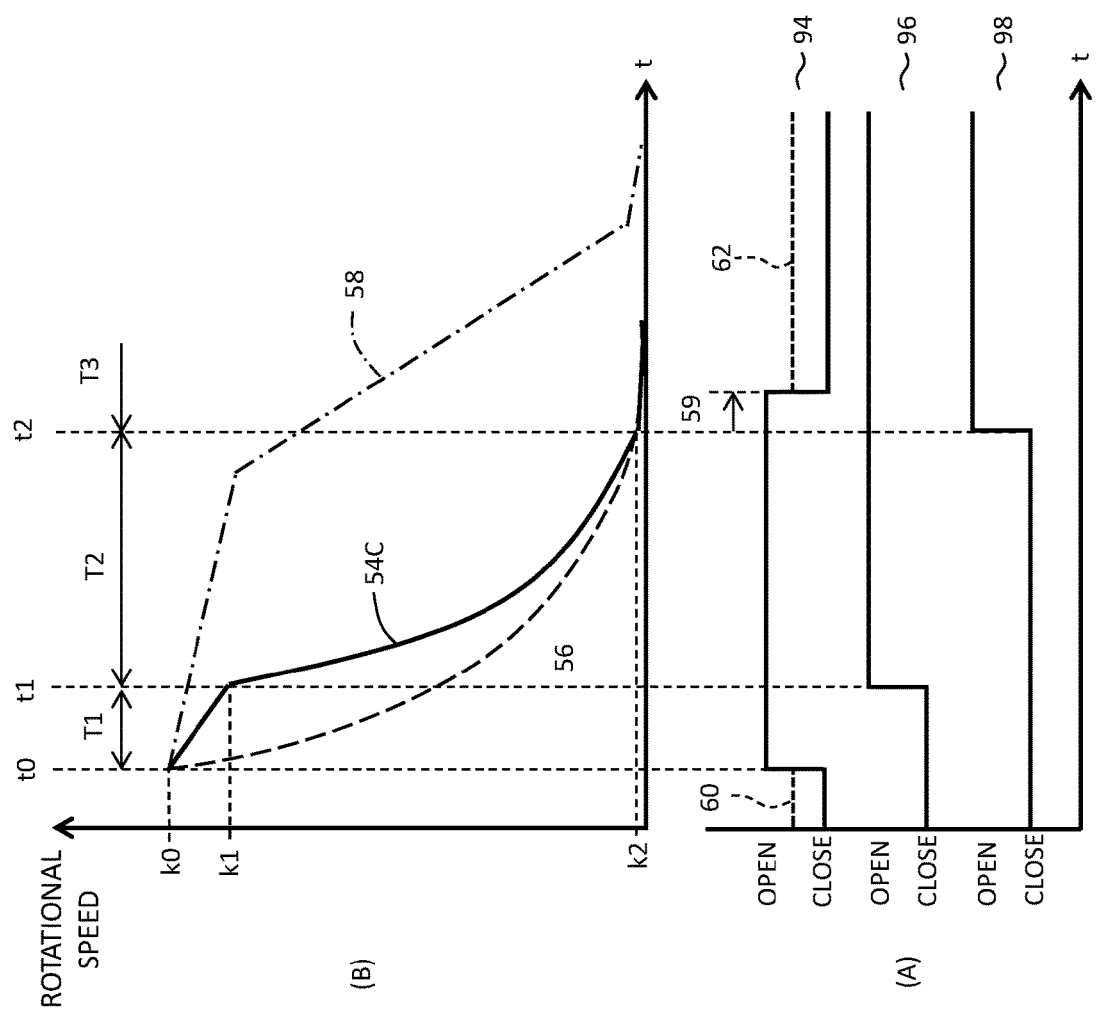
FIG. 9 is an explanatory diagram for explaining the operation of the ion beam processing apparatus according to the third embodiment.

FIGS. 7 to 9 illustrate a third embodiment. In FIGS. 7 to 9, the constituent components similar to those illustrated in FIGS. 1 to 6 are marked with the same reference numerals and the explanation thereof is omitted.

Again, in an ion beam processing apparatus 10C according to the third embodiment illustrated in FIG. 7, the raw material gas is supplied as the brake gas to the ion beam generator 14 using a gas supply system 32C. A port 82 is formed on the housing 12, to which piping 84 for ventilation is coupled. The piping 84 is branched into two, with one branch pipe 84A being connected to a primary vent valve 86, and a flow rate regulating valve 92 is also provided via piping 90. A secondary vent valve 88 is provided on the other branch pipe 84B. A controller 30C controls the operations of the gas supply system 32C, the primary vent valve 86, and the secondary vent valve 88. The flow rate regulating valve 92 is a regulating valve that can control the flow rate manually.

FIG. 8 illustrates the operation of the third embodiment. In S10, the rundown of the turbo molecular pump starts, and in S12, the supply of brake gas (raw material gas) to the ion beam generator starts. When it is determined that the rotational speed has dropped to or fallen below k1 in S14, the primary vent valve is opened in S26. This causes the atmospheric air with the flow rate regulated by the flow rate regulating valve to be introduced into the sample chamber through the primary vent valve. When it is determined that the rotational speed is at or below k2 in S18, the secondary vent valve is opened in S28. As a result, the sample chamber comes to be at atmospheric pressure. In S22, the supply of the brake gas stops.

FIG. 9 specifically illustrates the operation of the third embodiment. The lower part (A) of FIG. 9 shows the operation of the flow rate regulator (see reference number 94), the operation of the primary vent valve (see reference number 96), and the operation of the secondary vent valve (see reference number 98). The upper part (B) of FIG. 9 shows a rotational speed change 54C according to the third embodiment.

At the start of the rundown of the turbo molecular pump; that is, from timing t0, the raw material gas is supplied to the ion beam generator as the brake gas. In this state, the rotational speed of the turbo molecular pump decreases slowly. At the point when the rotational speed has dropped to or fallen below k1; that is, at timing t1, the primary vent valve is opened. Subsequently, the rotational speed decreases relatively rapidly. When the rotational speed has dropped to or fallen below k2; that is, at timing t2, the secondary vent valve is opened. In the third embodiment, the supply of the raw material gas may also be maintained after the sample processing is completed (see reference number 60). The supply of the raw material gas may be maintained regardless of the decrease in the rotational speed (see reference number 62).

Figure 10:
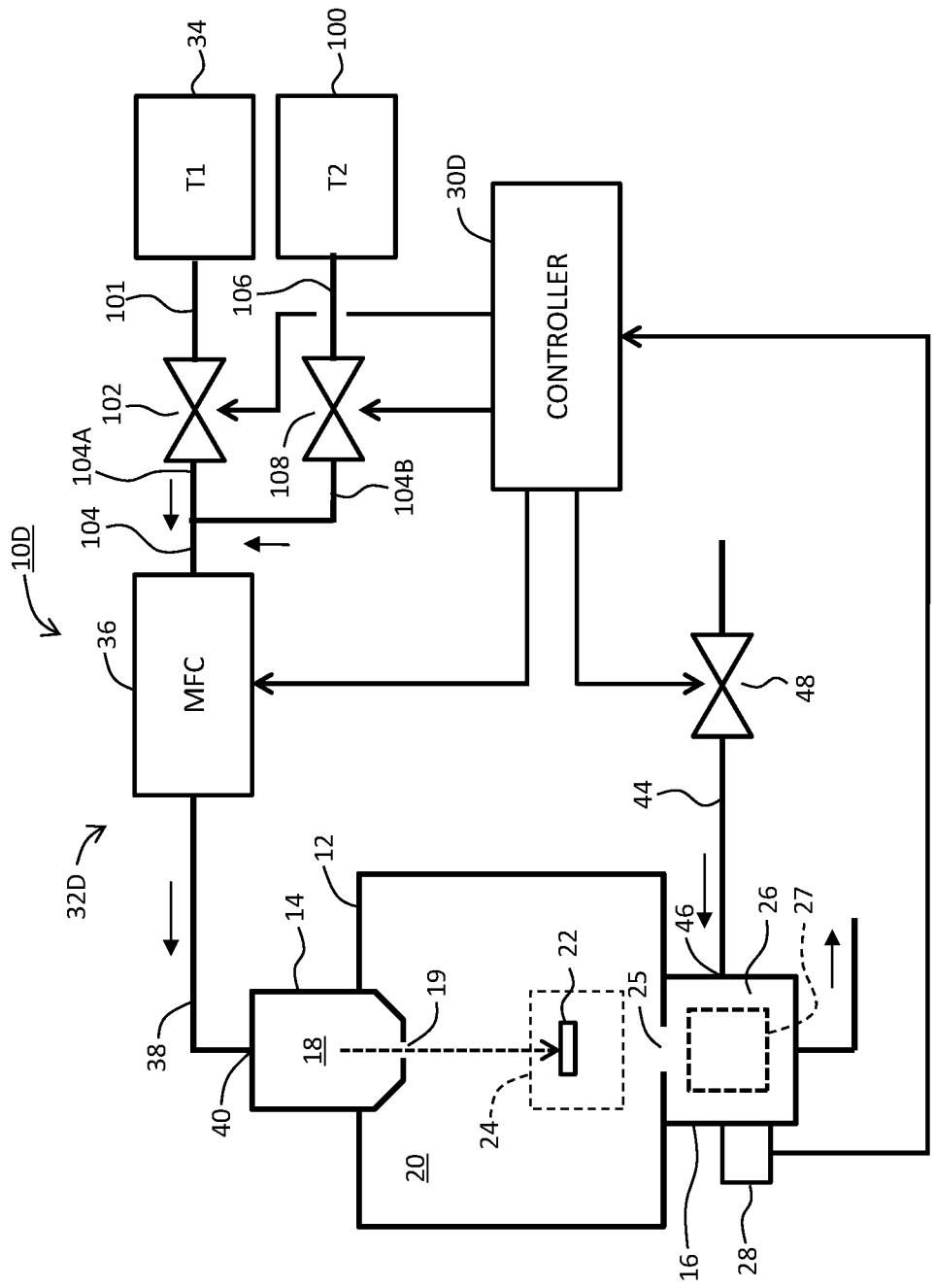
FIG. 10 is a schematic diagram illustrating the configuration of an ion beam processing apparatus according to a fourth embodiment.
Figure 11:
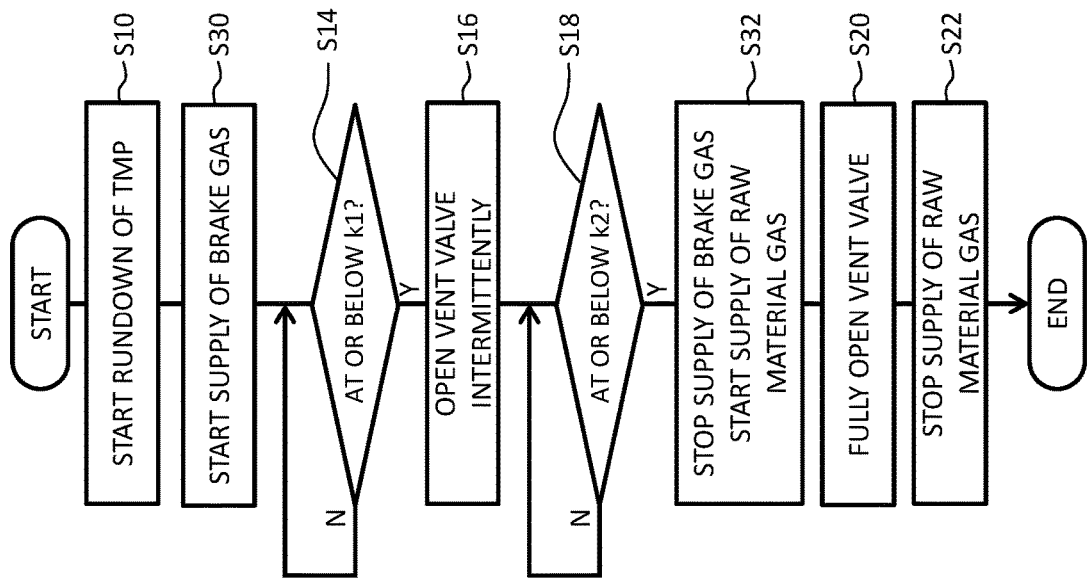
FIG. 11 is a flowchart illustrating the operation of the ion beam processor according to the fourth embodiment.
Figure 12:
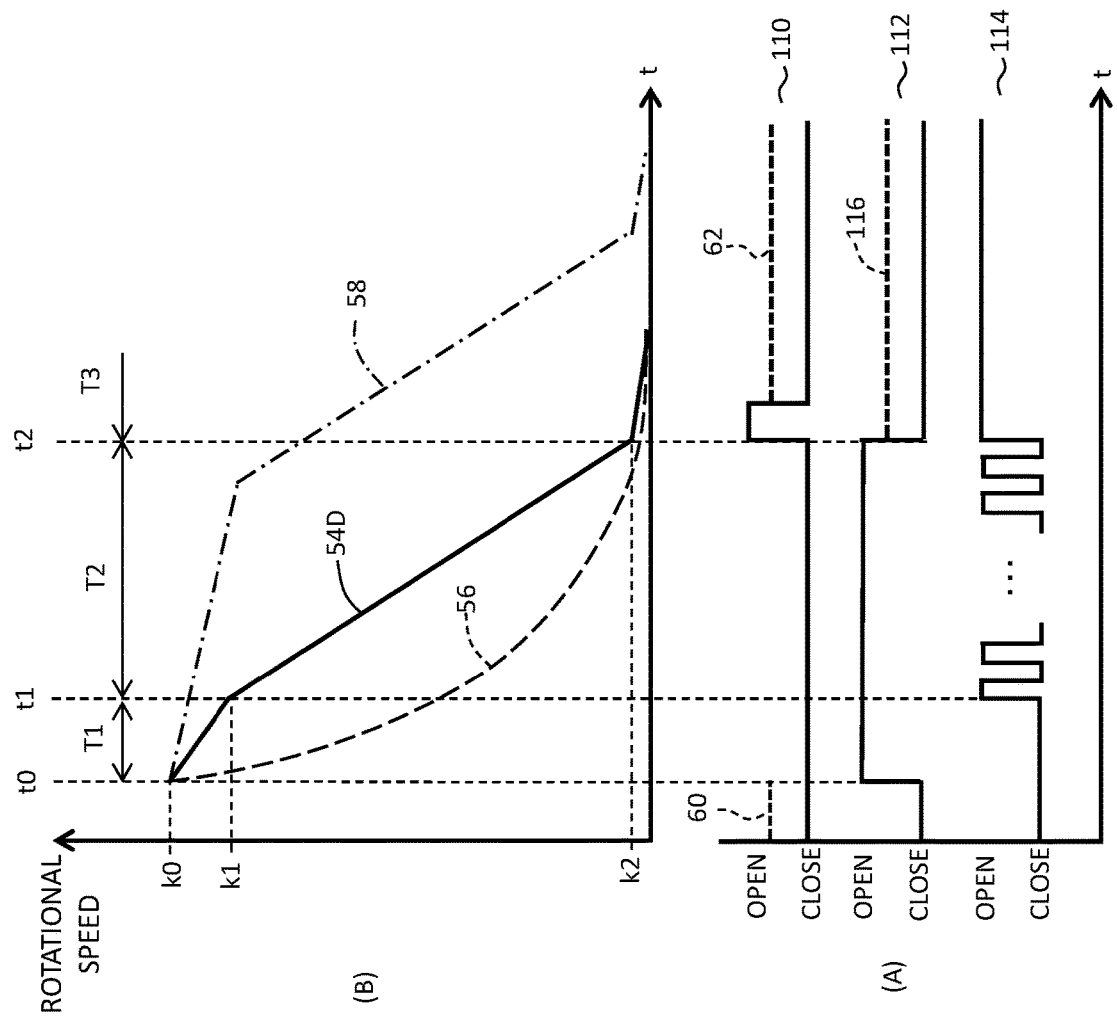
FIG. 12 is an explanatory diagram for explaining the operation of the ion beam processing apparatus according to the fourth embodiment.

FIGS. 10 to 12 illustrates a fourth embodiment. In FIGS. 10 to 12, the constituent components similar to those illustrated in FIGS. 1 to 9 are marked with the same reference numerals and the explanation thereof is omitted.

An ion beam processing system 10D according to the fourth embodiment includes a gas supply system 32D including a brake gas tank 100 in addition to the raw material gas tank 34. Specifically, piping 104 coupled to the flow rate regulator 36 is branched into two, with one branch pipe 104A being connected to the raw material gas tank 34 via a valve 102 and piping 101. The other branch pipe 104B is connected to the brake gas tank 100 via a valve 108 and piping 106. Like the first embodiment, in the fourth embodiment, the port 46 is formed on the housing of the turbo molecular pump 16, to which the vent valve 48 is connected via the piping 44. A controller 30D controls the operations of the gas supply system 32D and the vent valve 48.

The raw material gas is, for example, argon gas, and the brake gas is, for example, dry nitrogen gas. Alternatively, a high-purity argon gas may be used as the raw material gas, and a low-purity argon gas (lower than that of the raw material gas) may be used as the brake gas. The low-purity argon gas is less expensive than the high-purity argon gas.

FIG. 11 illustrates the operation of the fourth embodiment. In S10, the rundown of the turbo molecular pump starts. In S30, the supply of the brake gas dedicated for braking starts. In S14, when it is determined that the rotational speed has dropped to or below k1, the vent valve is intermittently opened in S16. In S18, when it is determined that the rotational speed is at or below k2, the supply of the brake gas is stopped and, instead, the supply of the raw material gas starts in S32. In S20, the vent valve is fully opened. In S22, the supply of the raw material gas stops. By temporarily supplying the brake gas in the last step, the brake gas is driven out of the ion beam generator, and the ionization chamber is filled with the raw material gas. In order to prevent the ingress of atmospheric air into the ion beam generator, continuous inflow of the raw material gas is required.

FIG. 12 illustrates the operation of the fourth embodiment. The lower part (A) of FIG. 12 shows the operation of the valve for supplying the raw material gas (see reference number 110), the operation of the valve for supplying the brake gas (see reference number 112), and the operation of the vent valve (see reference number 114). The upper part (B) of FIG. 12 shows a rotational speed change 54D according to the fourth embodiment.

At timing t0, the rundown of the turbo molecular pump starts, at which point the supply of the brake gas starts. At timing t1, when the rotational speed drops to or below k1, the vent valve starts to be opened intermittently. The intermittent opening is maintained for the entire period T2. At timing t2, when the rotational speed drops to or below k2, the intermittent opening of the vent valve stops and the vent valve is fully opened. At the same time, the raw material gas is temporarily supplied.

Again, in the fourth embodiment, the inflow of the raw material gas may be continued after processing of the sample (see reference number 60). The inflow of the raw material gas may continue after stopping the supply of the brake gas (see reference number 62). The supply of the brake gas may be maintained without stopping (see reference number 116).

Figure 13:
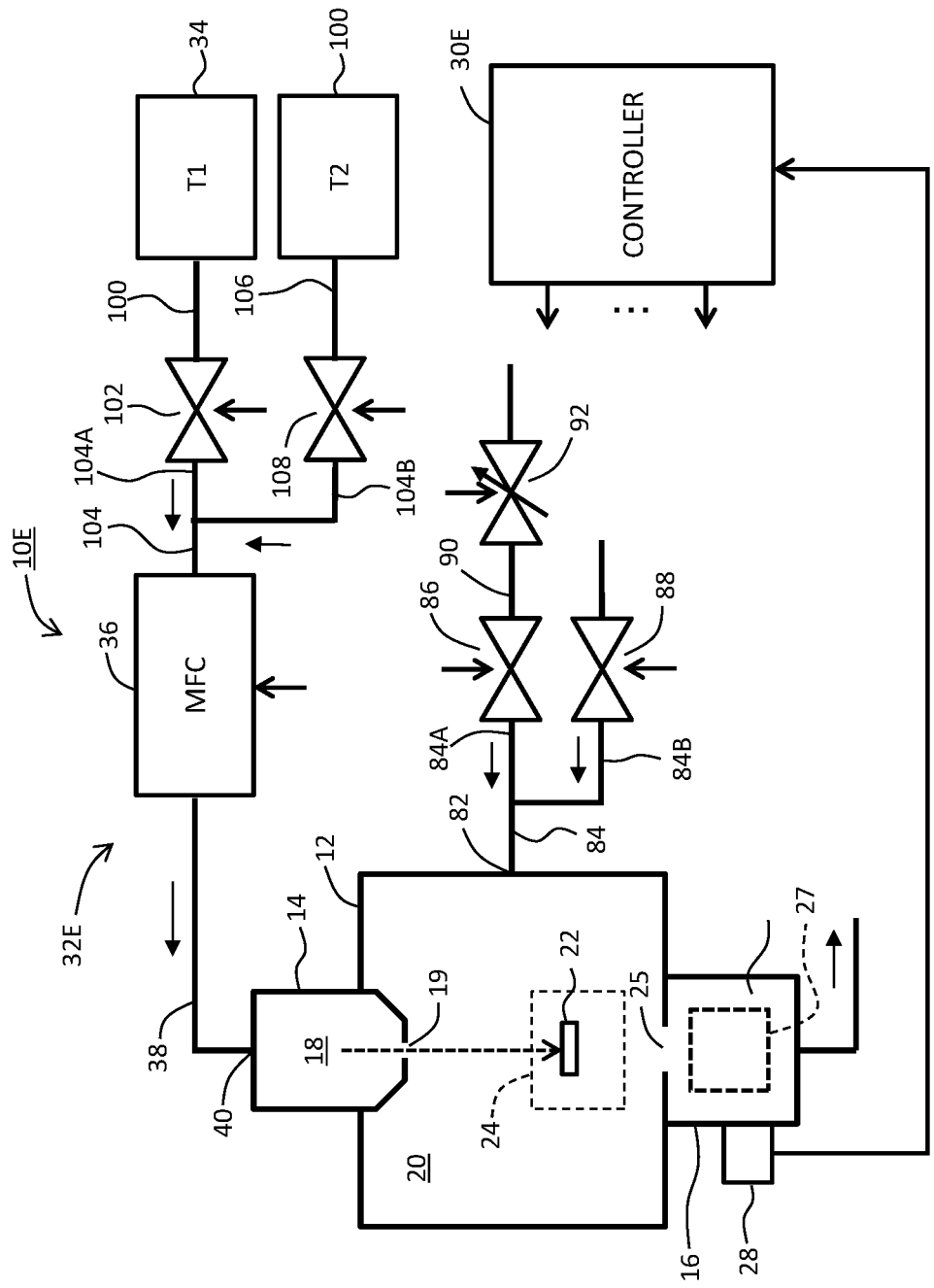
FIG. 13 is a schematic diagram illustrating the configuration of an ion beam processing apparatus according to a fifth embodiment.
Figure 14:
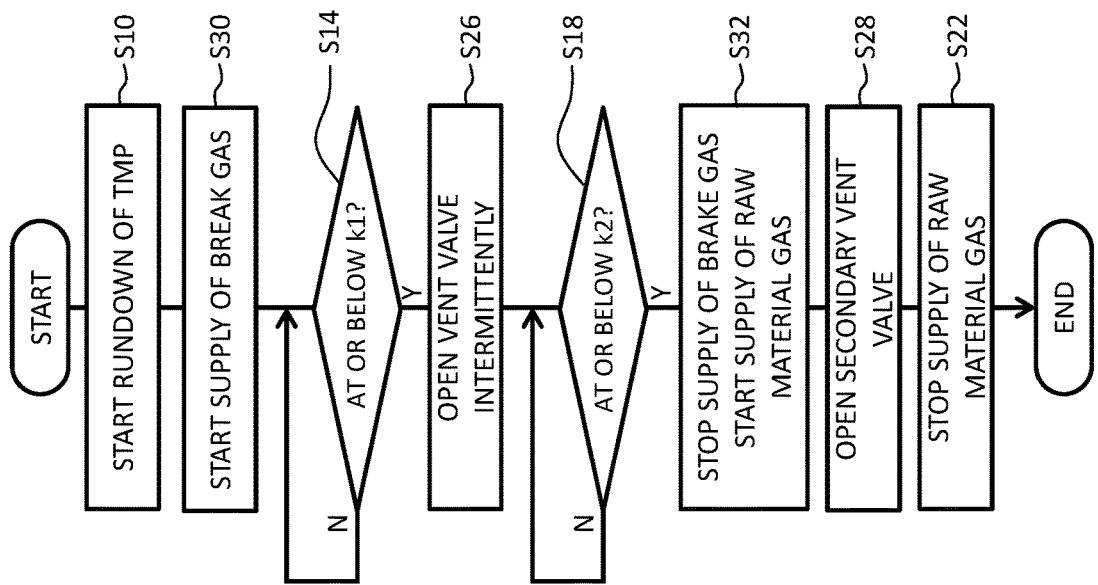
FIG. 14 is a flowchart illustrating the operation of the ion beam processor according to the fifth embodiment.
Figure 15:
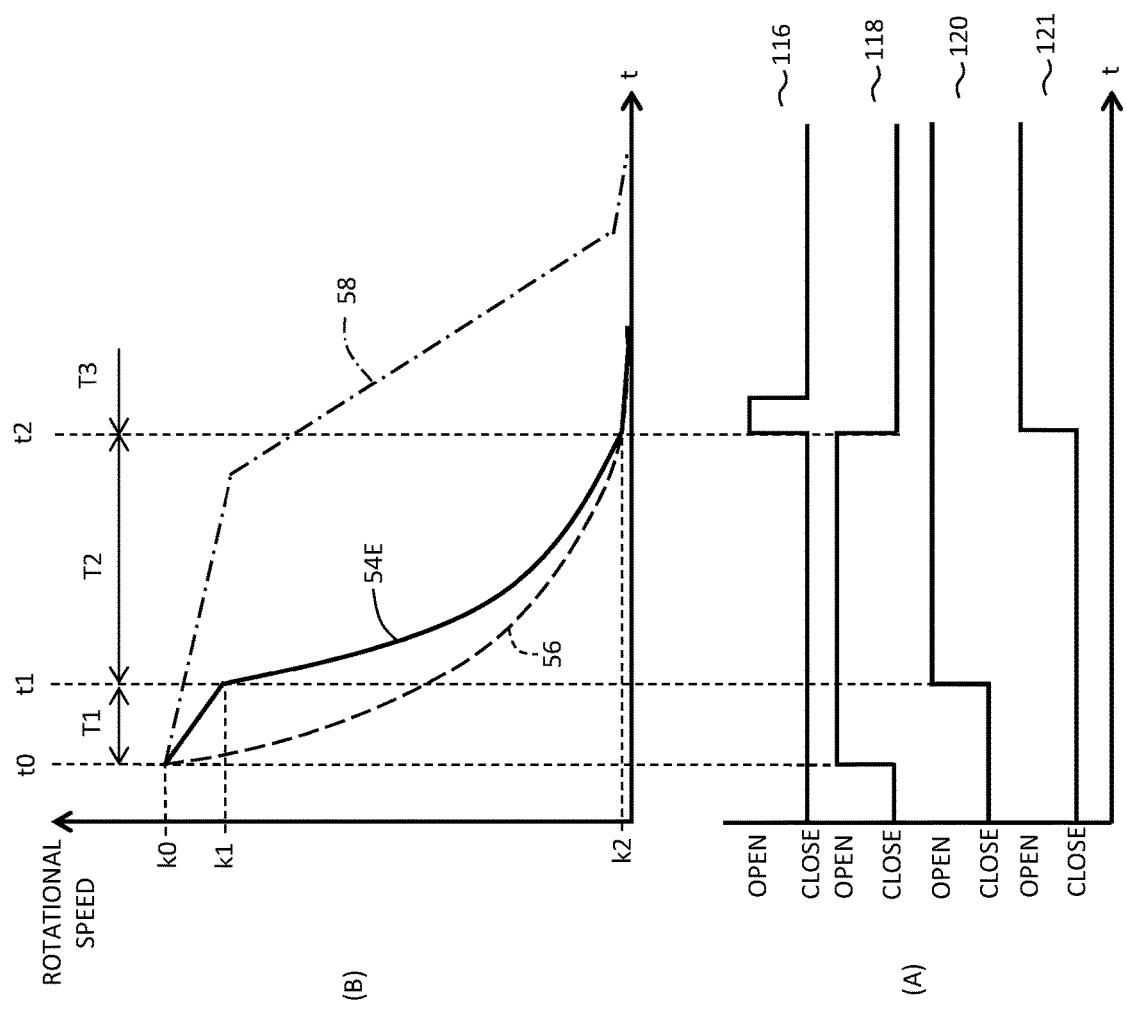
FIG. 15 is an explanatory diagram for explaining the operation of the ion beam processing apparatus according to the fifth embodiment.

FIGS. 13 to 15 illustrate a fifth embodiment. In FIGS. 13 to 15, the constituent components similar to those illustrated in FIGS. 1 to 12 are marked with the same reference numerals and the explanation thereof is omitted.

An ion beam processing apparatus 10E according to the fifth embodiment includes a gas supply system 32E having the same configuration as the gas supply system of the fourth embodiment. That is, the gas supply system 32E includes the brake gas tank 100 in addition to the raw material gas tank 34. The fifth embodiment also includes the primary vent valve 86, the flow rate regulating valve 92, and the secondary vent valve 88 as in the third embodiment. A controller 30E controls the operation of these constituent components.

FIG. 14 illustrates the operation of the fifth embodiment. In S10, the rundown of the turbo molecular pump starts. In S30, the supply of the brake gas starts. In S14, it is determined whether the rotational speed has dropped to or below k1. In S26, the primary vent valve is opened. In S18, it is determined whether the rotational speed has dropped to or below k2. In S32, the supply of the brake gas stops and the supply of raw material gas starts. In S28, the secondary vent valve is opened. In S22, the supply of the raw material gas stops. S32 and S28 are performed simultaneously.

FIG. 15 specifically illustrates the operation of the fifth embodiment. The lower part (A) of FIG. 15 shows the operation of the valve for supplying the raw material gas (see reference number 116), the operation of the valve for supplying the brake gas (see reference number 118), the operation of the primary vent valve (see reference number 120), and the operation of the secondary vent valve (see reference number 121). The upper part (B) of FIG. 15 shows a rotational speed change 54E according to the fifth embodiment.

At timing t0, the supply of the brake gas starts, and at timing t1, the primary vent valve is opened. At timing t2, the supply of the brake gas stops, and simultaneously, the secondary vent valve is opened. After timing t2, the raw material gas is temporarily supplied.

Again, in the fifth embodiment, the supply of the raw material gas may continue after processing the sample, and the inflow of the raw material gas may continue after stopping the supply of the brake gas. The supply of the brake gas may continue without stopping.

With reference to FIGS. 16 to 19, first and second comparative examples are described. In FIGS. 16 to 19, the constituent components that have already been described are marked with the same reference numerals and the explanation thereof is omitted.

Figure 16:
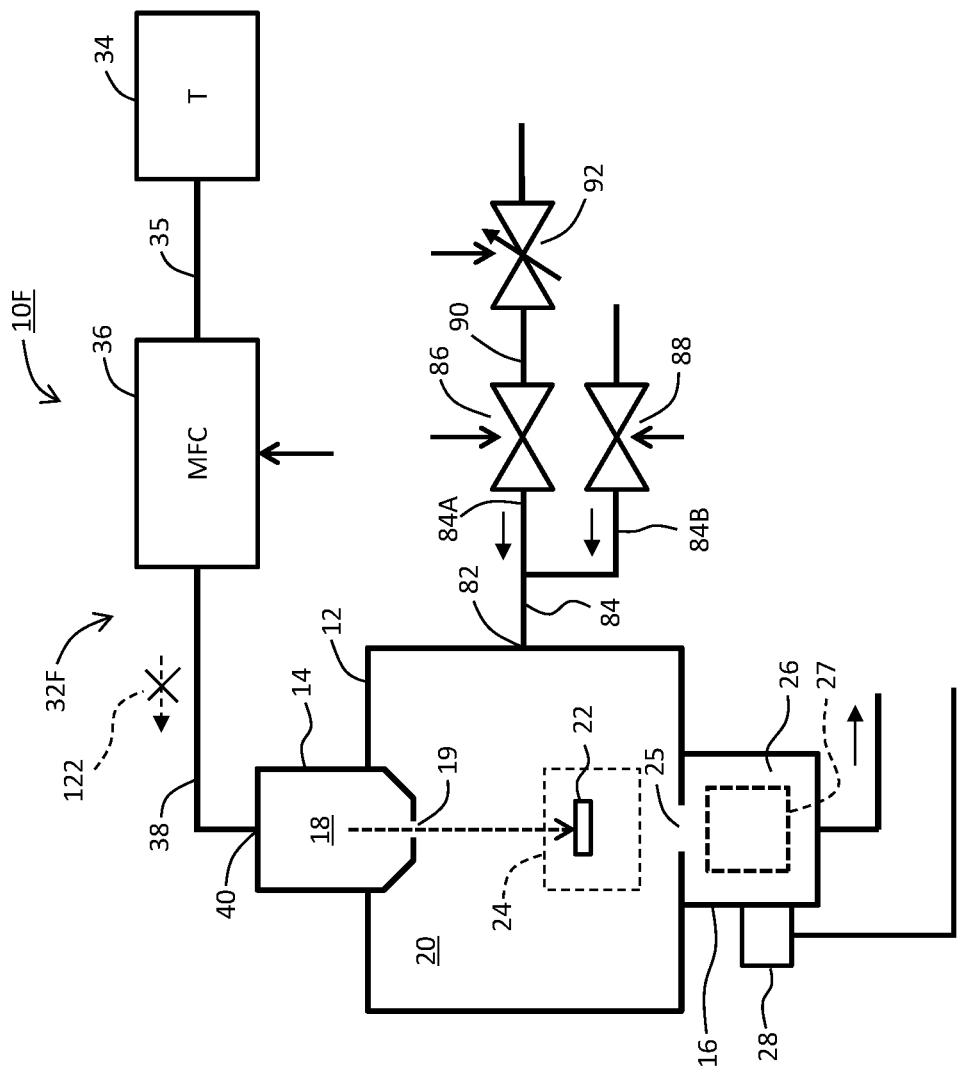
FIG. 16 is a schematic diagram illustrating the configuration of an ion beam processing apparatus according to a first comparative example.

FIG. 16 illustrates the configuration of a first comparative example. An ion beam processing system 10F includes a gas supply system 32F that supplies the raw material gas only during processing of the sample. The raw material gas is not supplied during rundown (see reference number 122). The port 82 is formed on the housing 12, and the primary vent valve 86 and the flow rate regulating valve 92 are connected to the port 82 through the pipe 84A connected to the port 82. The secondary vent valve 88 is connected to the port 82 through the pipe 84B. The flow rate regulating valve 92 is the regulating valve that can manually set the flow rate to a fixed value.

Figure 17:
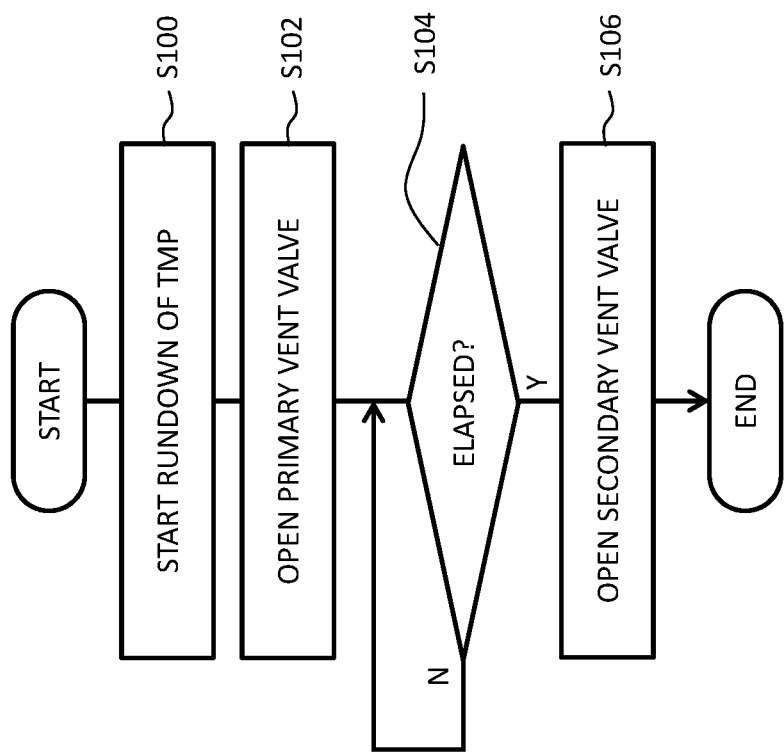
FIG. 17 is a flowchart illustrating the operation of the ion beam processing apparatus according to the first comparative example.

FIG. 17 illustrates the operation of the first comparative example. When the rundown of the turbo molecular pump starts in S100, the primary vent valve is opened in S102, and it is determined whether predetermined time has elapsed in S104. In S106, the secondary vent valve is opened. According to the first comparative example, the rotational speed change 56 is provided as shown in FIG. 3 and the like. As the primary vent valve is opened, atmospheric air enters the sample chamber and so on, causing a steep decrease in rotational speed and easily applying a large load on the turbo molecular pump. This can be avoided by restricting the flow rate of the primary vent valve, which, however, reduces the slope of the rate of change of the speed and increases the overall rundown time. It is practically difficult to set the flow rate of the primary vent valve properly, which may readily cause excessive or insufficient braking force on the turbo molecular pump.

Figure 18:
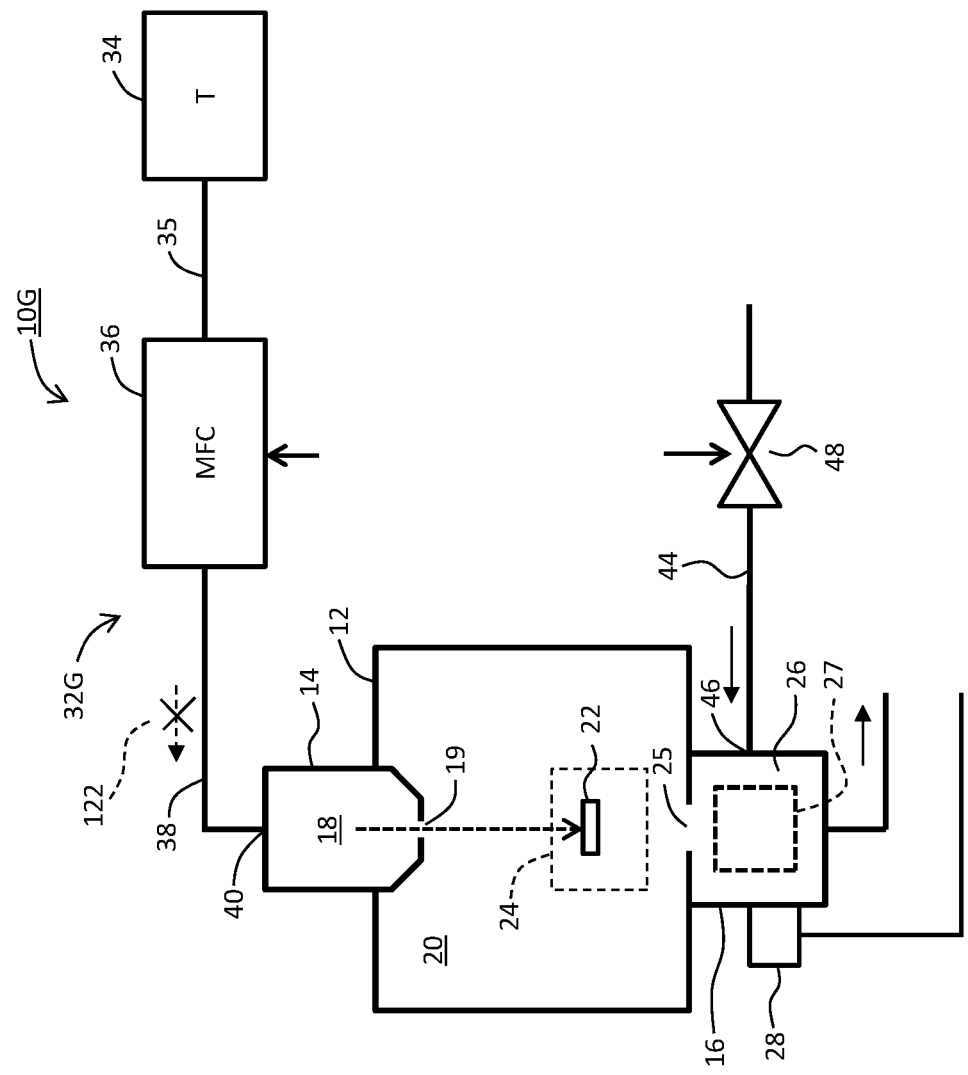
FIG. 18 is a schematic diagram illustrating the configuration of an ion beam processing apparatus according to a second comparative example.
Figure 19:
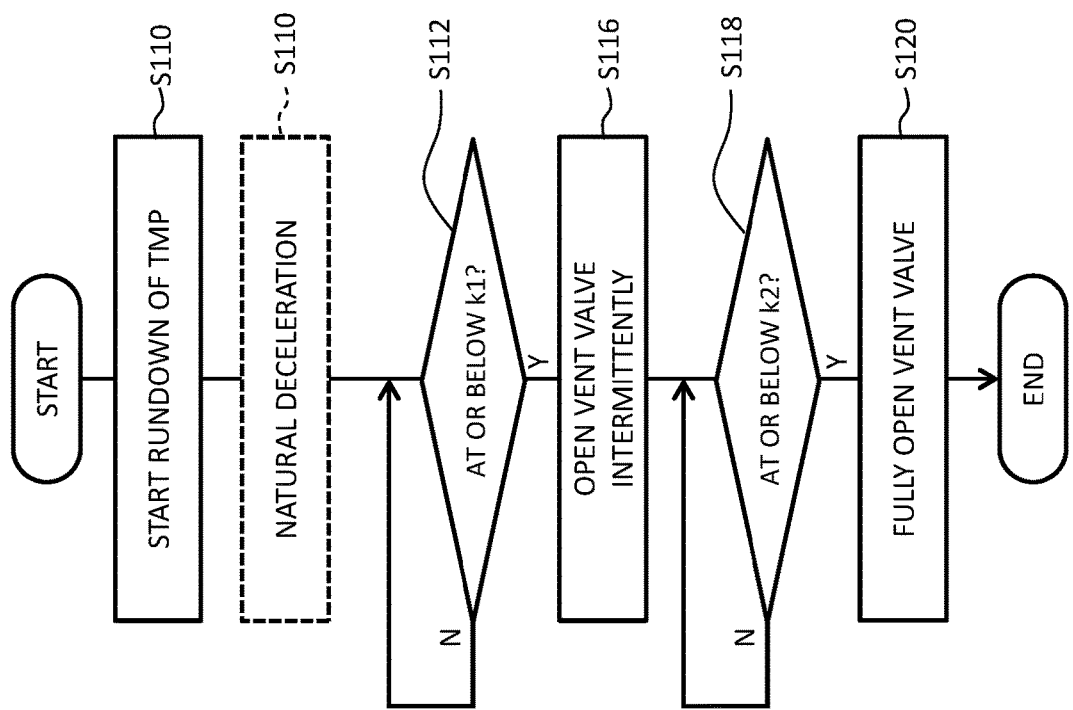
FIG. 19 is a flowchart illustrating the operation of the ion beam processing apparatus according to the second comparative example.

FIGS. 18 and 19 illustrate a second comparative example. In FIG. 18, an ion beam processing apparatus 10G according to the second comparative example includes a gas supply system 32G. The gas supply system 32G supplies the raw material gas only during processing of the sample. The raw material gas is not supplied during rundown (see reference number 122). The port 46 is formed on the housing of the turbo molecular pump, and the corresponding vent valve 48 is connected to the port 46 through the piping 44.

As illustrated in FIG. 19, in the second comparative example, when the rundown of the turbo molecular pump starts in S110, the waiting time starts until a certain deceleration is achieved by natural load (frictional force) in S110. Specifically, in S112, it is determined whether the rotational speed has dropped to or below k1, and the vent valve is intermittently opened in S116. After that, when the rotational speed has dropped to or below k2 in S118, the vent valve is fully opened in S120. According to the second comparative example, the rotational speed change 58 is provided as shown in FIG. 3 and the like. Since it is necessary to secure a long period of time to achieve the natural decrease of the rotational speed, the overall rundown time increases. In contrast, according to the embodiments described above, the appropriately controlled braking force can be applied to the turbo molecular pump using a part or all of the gas supply system to decrease the rundown time while preventing the application of the excessive load on the turbo molecular pump. In particular, according to the above-described embodiments, it is possible to utilize the existing gas supply system partially or entirely, so that the configuration can be simplified as compared to the case of installing a dedicated system for supplying the brake gas.

The invention claimed is:

1. An ion beam processing apparatus, comprising:
   an ion beam generator that includes an ionization chamber and generates an ion beam for processing a sample;
   a housing having a sample chamber communicating with the ionization chamber;
   a gas supply system that supplies a raw material gas to the ionization chamber;
   a turbo molecular pump that suctions the sample chamber and creates vacuum in the sample chamber and the ionization chamber; and
   a controller that controls the gas supply system by supplying a brake gas which is identical to or different from the raw material gas into the ionization chamber during deceleration of the turbo molecular pump, to thereby supply the brake gas into the turbo molecular pump from the ionization chamber through the sample chamber.

2. The ion beam processing apparatus according to claim 1, wherein
   the gas supply system comprises
      piping drawn from a gas inlet port of the ion beam generator, and
      a flow rate regulator provided on the piping, and
   the controller controls the flow rate regulator during the deceleration to regulate the flow rate of the brake gas flowing through the flow rate regulator.

3. The ion beam processing apparatus according to claim 2, wherein
   the gas supply system comprises a raw material gas tank that feeds the raw material gas to the flow rate regulator, and
   the raw material gas is used as the brake gas.

4. The ion beam processing apparatus according to claim 3, wherein
   an atmospheric release state in which an interior of the turbo molecular pump is opened to atmosphere occurs after the deceleration, and
   the controller controls the flow rate regulator to supply the raw material gas to the ionization chamber in the atmospheric release state.

5. The ion beam processing apparatus according to claim 2, further comprising:
   a raw material gas tank that feeds the raw material gas to the flow rate regulator; and
   a brake gas tank that feeds the brake gas to the flow rate regulator, wherein
   the brake gas is fed to the flow rate regulator during the deceleration.

6. The ion beam processing apparatus according to claim 5, wherein
   an atmospheric release state in which an interior of the turbo molecular pump is opened to atmosphere occurs after the deceleration, and
   the controller controls the flow rate regulator to supply the brake gas or the raw material gas to the ionization chamber in the atmospheric release state.

7. The ion beam processing apparatus according to claim 1, further comprising:
   an atmospheric relief valve, wherein
   the controller controls the atmospheric relief valve to supply atmospheric air into the sample chamber or the turbo molecular pump in a middle of the deceleration.

\* \* \* \* \*